(12) United States Patent
Danet et al.

(10) Patent No.: US 11,507,026 B2
(45) Date of Patent: Nov. 22, 2022

(54) MINIATURE ATOMIC CLOCK WITH PULSE MODE OPERATION

(71) Applicant: SYRLINKS, Cesson Sevigne (FR)

(72) Inventors: Jean-Marie Danet, Rennes (FR); Romain Broucquart, Cesson Sevigne (FR)

(73) Assignee: SYRLINKS, Cesson Sevigne (FR)

( * ) Notice: Subject to any disclaimer, the term of this patent is extended or adjusted under 35 U.S.C. 154(b) by 0 days.

(21) Appl. No.: 17/602,569

(22) PCT Filed: Mar. 30, 2020

(86) PCT No.: PCT/EP2020/058914
§ 371 (c)(1),
(2) Date: Oct. 8, 2021

(87) PCT Pub. No.: WO2020/207837
PCT Pub. Date: Oct. 15, 2020

(65) Prior Publication Data
US 2022/0179370 A1    Jun. 9, 2022

(30) Foreign Application Priority Data

Apr. 8, 2019  (FR) ...................................... 1903687

(51) Int. Cl.
*G04F 5/14* (2006.01)
*H03L 7/26* (2006.01)
(52) U.S. Cl.
CPC ................ *G04F 5/145* (2013.01); *H03L 7/26* (2013.01)
(58) Field of Classification Search
CPC ...................................................... G04F 5/145

USPC ......................................................... 331/94.1
See application file for complete search history.

(56) References Cited

U.S. PATENT DOCUMENTS

2017/0356803 A1\* 12/2017 Bertoldi .................. G01J 3/453
2018/0321641 A1\* 11/2018 Boyd ....................... H05H 3/02

OTHER PUBLICATIONS

International Search Report dated May 19, 2020 for corresponding International Application No. PCT/EP2020/058914, dated Mar. 30, 2020.

(Continued)

*Primary Examiner* — Joseph Chang
(74) *Attorney, Agent, or Firm* — David D. Brush; Westman, Champlin & Koehler, P.A.

(57) ABSTRACT

A miniature atomic clock with pulse mode operation. The clock includes: a local oscillator; a dual-frequency laser source; a pulsing element to pulse the output signal from the source according to a Ramsey-type interrogation sequence having pulses with duration T1 separated by intervals with duration T2; an alkaline vapour microcell; a photodiode; a feedback control loop for controlling the microwave frequency of the local oscillator; and a feedback control loop for controlling the optical frequency of the source by using a pulse control block receiving the output signal from the photodiode and the interrogation sequence, and providing a correction signal to the source. During the period T1, the block extracts an error signal from the output signal received from the photodiode and generates the correction signal from the error signal. During the period T2, the block resets the error signal to zero and generates the correction signal by extrapolation.

6 Claims, 10 Drawing Sheets

(56) References Cited

OTHER PUBLICATIONS

Written Opinion of the International Searching Authority dated May 29, 2020 for corresponding International Application No. PCT/EP2020/058914, filed Mar. 30, 2020.
Warren Z et al., "Pulsed coherent population trapping with repeated queries for producing single-peaked high contrast Ramsey interference", Feb. 6, 2018 (Feb. 6, 2018), vol. 123, No. 5, XP012226150.
Abdel Hafiz M et al., "Symmetric autobalanced Ramsey interrogation for high-performance coherent-population-trapping vapor-cell atomic clock", Jun. 13, 2018 (Jun. 13, 2018), vol. 112, No. 24, XP012229193.
C. Sanner, et al., "Autobalanced Ramsey Spectroscopy", Physical Review Letters, vol. 120, Jan. 30, 2018 (Jan. 30, 2018), XP002795476.
Sun X L et al., "Suppression of Dick Effect in the Ramsey-CPT atomic clock by Interleaving Lock", arxiv.org, Cornell University Library, 201 Olin Library Cornell University Ithaca, NY 14853, Jul. 6, 2017 (Jul. 6, 2017), XP080779056.
Sinda Mejri et al., "Atomic clock using coherent population trapping in a cesium cell: frequency stability and limitations", Jul. 4, 2016 (Jul. 4, 2016), vol. 723, No. 1, p. 12014, XP020304817.
Shuker M et al., "Reduction of light shifts in Ramsey spectroscopy with a combined error signal", arxiv.org, Cornell University Library, 201 Olin Library Cornell University Ithaca, NY 14853, Mar. 1, 2019 (Mar. 1, 2019), XP081122211.
Danet Jean-Marie et al., "Dick effect in a pulsed atomic clock using coherent population trapping", Apr. 1, 2014 (Apr. 1, 2014), vol. 61, No. 4, p. 567-574, XP011549631.
S. Knappe et al., "A microfabricated atomic clock", Applied Physics Letters, vol. 85, No. 9, pp. 1460-1462, Aug. 30, 2004, DOI: 10.1063/1.1787942.
Boudot et al., "A High-Performance Frequency Stability Compact CPT Clock Based on a Cs—Ne Microcell", IEEE UFFC, vol. 59, No. 11, HAL Id: hal-00776544 https://hal.archives-ouvertes.fr/hal-00776544, Apr. 18, 2021.
J. Vanier, "Atomic clocks based on coherent population trapping: A review", Applied Physics B, vol. 81, No. 4, pp. 421-442, Jul. 22, 2005, DOI: 10.1007/s00340-005-1905-3.
F. A. Camargo et al., "Tunable dual-frequency laser source for coherent population trapping cesium atomic clock", International Conference on Space Optics—ICSO 2012, Oct. 9-12, 2012, DOI: 10.1117/12.2309273.

* cited by examiner

MINIATURE ATOMIC CLOCK WITH PULSE MODE OPERATION

1. CROSS-REFERENCE TO RELATED APPLICATIONS

This Application is a Section 371 National Stage Application of International Application No. PCT/EP2020/058914, filed Mar. 30, 2020, the content of which is incorporated herein by reference in its entirety, and published as WO 2020/207837 on Oct. 15, 2020, not in English.

2. TECHNICAL FIELD

The field of the invention is that of time references, in particular that of alkaline vapour microcell miniature atomic clocks using coherent population trapping (CPT).

This type of miniature atomic clock (called "CPT miniature atomic clock") is described, for example, in the following articles:

S. Knappe et al. "*A microfabricated atomic clock*", Appl. Phys. Lett., vol. 85, no. 9, pp. 1460-1462, 2004;

Boudot et al. "*High-Performance Frequency Stability Compact CPT Clock Based on a Cs-Ne Microcell*" IEEE UFFC, vol59, n11, November 2012;

J. Vanier, "*Atomic clocks based on coherent population trapping: A review*", Appl. Phys. B, vol. 81, no. 4, pp. 421-442, 2005.

The output signal of such a miniature atomic clock is an electrical signal oscillating at a stable frequency. The term "stable" means an Allan deviation of about $10^{-10}$-$10^{-11}$ for integration durations of a second and of 10-10-10-12 after one day of integration.

More precisely, the invention relates to a CPT miniature atomic clock with pulse mode operation (also called "CPT miniature atomic clock with Ramsey-type interrogation").

3. TECHNOLOGICAL BACKGROUND

CPT miniature atomic clocks with pulse mode operation allow for an improvement in performance in relation to CPT miniature atomic clocks with continuous mode operation.

An architecture of CPT miniature atomic clock with pulse mode operation has already been demonstrated and described in the following article: Abdel Hafiz et al., "*Symmetric autobalanced Ramsey interrogation for high-performance coherent-population-trapping vapor-cell atomic clock*", APL 112 244102 2018.

As far as the inventors are aware, this architecture is the only known architecture to date.

As shown in FIG. 1, a CPT miniature atomic clock 100 with pulse mode operation comprises, according to this known technique:

a local oscillator 125 having a microwave frequency;

a dual-frequency laser source 102 receiving an output signal 129 from the local oscillator 125 and having an optical frequency. The frequency deviation between the spectral components of the output signal (laser beam) of the dual-frequency laser source 102 is equal to the frequency of the local oscillator 125;

means 300 configured to pulse the laser beam of the dual-frequency laser source 102, according to a Ramsey-type interrogation sequence 144 (also called "Ramsey sequence") comprising pulses with a duration T1 separated by intervals with a duration T2. More precisely, the means 300 comprise an optical switch 301, placed between the dual-frequency laser source 102 and a formatting optical element 103, and which is controlled by the interrogation sequence 144. FIG. 2 shows the Ramsey sequence 144 and the pulse (laser beam) signal 140 obtained at the output of the optical switch 301, from the output signal (laser beam) of the dual-frequency laser source;

an alkaline vapour microcell 104 receiving (via the formatting optical element 103) the pulsed laser beam 140 and using coherent population trapping. Once out of the alkaline vapour microcell 104, the pulsed laser beam carries, on its light intensity, a piece of comparison information between the microwave frequency of the local oscillator 125 and a microwave frequency setpoint. This microwave frequency setpoint is the resonance frequency of the hyperfine structure of the atoms of the alkaline vapour of the microcell 104;

a photodiode 105 receiving an output signal from the alkaline vapour microcell 104. The photodiode 105 transforms the pulsed light intensity into an electrical signal 106 that also carries the comparison information between the microwave frequency of the local oscillator 125 and the microwave frequency setpoint;

a feedback control loop for controlling the microwave frequency 500, receiving a signal 114 (resulting from the filtering of the output signal 106 of the photodiode 105 by a first filter 127) and configured to control the microwave frequency of the local oscillator 125 at the microwave frequency setpoint (resonance frequency of the hyperfine structure of the atoms of the alkaline vapour of the microcell 104); and a feedback control loop for controlling the optical frequency 400, configured to control the optical frequency of the dual-frequency laser source 102 at an optical frequency setpoint.

More precisely, the feedback control loop for controlling the microwave frequency 500 comprises a pulse control block SERVO_1 that generates and provides a first correction signal $\delta\_c\_1$ to the local oscillator 125, in order to control the microwave frequency with it. In other terms, the interpretation of the signal 114 by the pulse control block SERVO_1 generates an error signal (comparison signal) $\delta\_e\_1$, which is negative or positive according to the result of the aforementioned comparison. According to the error signal $\delta\_e\_1$, the pulse control block SERVO_1 generates a correction signal (retroaction signal) $\delta\_c\_1$ acting on the microwave frequency of the local oscillator 125. The element SERVO_1 is therefore a control and regulation element the objective of which is to retroact the microwave frequency of the local oscillator 125 so as to minimise its difference with the microwave resonance frequency of the alkaline vapour of the microcell 104.

In a particular implementation shown in FIG. 3, the pulse control block SERVO_1 comprises:

a modulation block 32 generating a modulation signal mod_1 used on the one hand by the local oscillator 125 to modulate its output signal, and on the other hand by a synchronous detection block 31 presented hereinbelow (for carrying out demodulation steps internal to the synchronous detection block 31 which will result in the filtering then in the extracting of an error signal $\delta\_e\_1$);

the synchronous detection block 31 carrying out a demodulation of the signal 114 coming from the filter 127 (downstream from the photodiode 105), according to the modulation signal mod 1, and generating an error signal $\delta\_e\_1$. In other terms, the synchronous detection block 31 makes it possible to extract an error signal $\delta\_e\_1$ from the signal 114; and a correction/hold block 33 (with 0-order hold) receiving the error signal δ_e_1 and generating the correction signal δ_c_1 (of which the application on the local oscillator 125 has for objective to minimise the error signal δ_e_1).

FIG. 5 shows the operation of the pulse control block SERVO_1 of FIG. 3, by showing chronograms of the signal referenced as 140 in FIGS. 1 and 2, as well as of the signals referenced as mod_1, δ_e_1 and δ_c_1 in FIG. 3. Thus, in the case of a CPT atomic clock with pulse mode operation, the pulse control block SERVO_1 samples, at the frequency of the Ramsey sequence 144, the signal 114 coming (via the filter 127) from the photodiode 105. Given that the modulation frequency of the modulation signal mod_1 is typically twice as low than the frequency (1/(T1+T2)) of the Ramsey sequence, the sampling at the frequency of the Ramsey sequence makes it possible to generate a value of the error signal δ_e_1 for each state of the modulation signal mod_1. Conventionally, a correction is calculated and a system of the 0-order hold type is used to generate the correction signal δ_c_1 and make it continuous. At each new value of the error signal δ_e_1, a new value of the correction signal is generated, then maintained until the availability of a new value of the error signal. The feedback control loop for controlling the microwave frequency thus carried out has a bandwidth limited by the frequency of the Ramsey sequence.

The feedback control loop for controlling the optical frequency 400 comprises:
  a separator 149, placed between the dual-frequency laser source 102 and the optical switch 301, making it possible to divert a portion of the light beam from the dual-frequency laser source to a second alkaline vapour microcell 143;
  the second alkaline vapour microcell 143. Once out of the second alkaline vapour microcell 143, the laser beam (non-pulsed) carries, on its light intensity, a piece of comparison information between the optical frequency of the dual-frequency laser source 102 and an optical frequency setpoint. This optical frequency setpoint is the optical frequency of the atoms of the alkaline vapour of the second microcell 143;
  a second photodiode 141, receiving an output signal from the second alkaline vapour microcell 143. The second photodiode 141 transforms the light intensity into an electrical signal 146 that also carries the comparison information between the optical frequency of the dual-frequency laser source 102 and the optical frequency setpoint;
  a second filter 142, receiving the output signal 146 from the second photodiode 105 and generating a signal 145;
  a non-pulsed control block SERVO_2, that receives the signal 145 and that generates and provides a correction signal δ_c_2 to the dual-frequency laser source 102, in order to control the optical frequency with it. The control block SERVO_2 operates without discontinuity.

In a particular implementation shown in FIG. 4, the pulse control block SERVO_2 comprises:
  a modulation block 42 generating a modulation signal mod_2 used by the dual-frequency laser source 102 to modulate its output signal;
  a synchronous detection block 41 carrying out a demodulation of the signal 145 coming from the second filter 142 (downstream from the second photodiode 141), according to the modulation signal mod_2, and generating an error signal δ_e_2; and
  a correction block 43 receiving the error signal δ_e_2 and generating the correction signal δ_c_2.

A disadvantage of this known technique is that it does not have optimum characteristics in terms of size and cost, due to the fact that the feedback control loop for controlling the optical frequency 400 requires various components such as the separator 149, the second alkaline vapour microcell 143 and the second photodiode 141. In other terms, this known technique aims to provide a miniature atomic clock that has a size/cost/performance compromise that is highly oriented on performance, to the detriment of the size and of the cost.

Another disadvantage of this known technique is that the optical switch 301, that makes it possible to pulse the output signal received from the dual-frequency laser source 102, must imperatively be placed between the separator 149 and the alkaline vapour microcell 104 so that the control block SERVO_2 operates without discontinuity and therefore the feedback control loop for controlling the optical frequency 400 generates without discontinuity an optimum correction signal δ_c_2. In other terms, there is no freedom for the implementation of means 300 configured to pulse the output signal received from the dual-frequency laser source 102.

The inventors have detected a need for a CPT miniature atomic clock, with pulse mode operation and which has a new size/cost/performance compromise, oriented towards low cost and small size, while still degrading performance as little as possible.

4. SUMMARY

In a particular embodiment of the invention, a miniature atomic clock with pulse mode operation is proposed and comprising:
  a local oscillator having a microwave frequency;
  a dual-frequency laser source receiving an output signal from the local oscillator and having an optical frequency;
  means configured to pulse an output signal from the dual-frequency laser source, according to a Ramsey-type interrogation sequence comprising pulses with a duration T1 separated by intervals with a duration T2;
  an alkaline vapour microcell receiving the output signal from the dual-frequency laser source and using coherent population trapping;
  a photodiode receiving an output signal from the alkaline vapour microcell;
  a feedback control loop for controlling the microwave frequency, receiving an output signal from the photodiode and configured to control the microwave frequency of the local oscillator at a microwave frequency setpoint according to the alkaline vapour microcell; and
  a feedback control loop for controlling the optical frequency, configured to control the optical frequency of the dual-frequency laser source at an optical frequency setpoint.

According to the proposed solution, the feedback control loop for controlling the optical frequency comprises a pulse control block receiving the output signal from the photodiode and the interrogation sequence, and providing a correction signal to the dual-frequency laser source by being configured to act as follows:
  during the period T1, extraction of the error signal from the output signal received from the photodiode and generation of the correction signal from the error signal; and during the period T2, resetting of the error signal to zero and generation of the correction signal by extrapolation.

Thus, the proposed solution proposes an entirely new and inventive approach consisting of using the same alkaline vapour microcell for the feedback control loop for controlling the microwave frequency and for the feedback control loop for controlling the optical frequency. Contrary to the known solution discussed hereinabove, the proposed solution includes less components for carrying out the feedback control loop for controlling the optical frequency (no separator, no second alkaline vapour microcell and no second photodiode). Moreover, in the feedback control loop for controlling the optical frequency of the proposed solution, the control block is pulsed and therefore of a nature different from the control block (non-pulsed) comprised in the feedback control loop for controlling the optical frequency of the known solution. Thus makes it possible to obtain a CPT miniature atomic clock with pulse mode operation and which offers the new size/cost/performance compromise sought, i.e. oriented towards low cost and small size, while still degrading performance as little as possible.

Another advantage is that the miniature clock of the proposed solution is simpler to manufacture and implement than that of the known solution.

Yet another advantage is that the miniature clock of the proposed solution offers more freedom than the known solution for implementing means 300 configured to pulse the output signal received from the dual-frequency laser source. Indeed, as detailed hereinafter (see FIGS. 10 to 12), various implementations of means 300 can be considered since the control block SERVO_1 of the feedback control loop for controlling the microwave frequency and the control block SERVO_2 of the feedback control loop for controlling the optical frequency are both control blocks of the pulsed type.

According to a particular characteristic, the miniature atomic clock comprises a modulation block generating a modulation signal used by the dual-frequency laser source to modulate the output signal received from the dual-frequency laser source). The pulse control block comprises: a synchronous detection block carrying out a demodulation of the output signal received from the photodiode according to the modulation signal, and generating the error signal; and a correction block receiving the error signal and generating the correction signal. The modulation signal and the interrogation sequence are linked by one of the following relationships: $f_m = K \times 1/T1$ and $1/T1 = K' \times f_m$, with $f_m$ the frequency of the modulation signal, and K and K' belonging to natural integers.

Thus, the modulation signal is synchronous with the pulses (of duration T1) of the interrogation sequence, which allows for an optimisation of the calculation of the error signal.

According to a particular characteristic, the modulation signal and the interrogation sequence are linked by the relationship: $f_m = K \times 1/T1$, with: $1 \leq K \leq 30$.

This has the advantage of having:
- a modulation frequency $f_m$ that is high enough to be able to control the optical frequency of the dual-frequency laser source with a frequency band wherein the noise of the dual-frequency laser source is low, and
- a modulation frequency $f_m$ that is low enough to prevent excessively energy-consuming electronics.

According to a particular characteristic, the synchronous detection block is configured to generate the error signal at R times the frequency $f_m$ of the modulation signal, with R an even number belonging to natural integers, and $R \geq 2$.

In this way, the output signal received from the photodiode is sampled at a frequency $R*f_m$, which makes it possible to generate at the same frequency successive values of the error signal. Because $R \geq 2$, there is at least one value of the error signal for each state of the modulation signal. Moreover, choosing an even value of R makes it possible to facilitate the work of a calculator comprised in the pulse control block.

According to a first particular implementation, the pulse control block is configured so that, during the period T2, the generation of the correction signal by extrapolation is carried out using a 0-order hold.

In this first particular implementation, the implementation of the holding function during each period T2 is simple since based on a 0-order hold.

According to a second particular implementation, the pulse control block is configured so that, during the period T2, the generation of the correction signal by extrapolation is carried out using an N-order hold, with $N > 0$ or a function for formatting the correction signal.

In this second particular implementation, the implementation of the holding function during each period T2 is a little less simple (since based on an $N > 0$ order hold or on a formatting function), but this makes it possible to control the optical frequency more continuously. The function for formatting the correction signal can be an extrapolation which has the advantage of compensating the deviations well of which the frequency variation is less than 1/T1. The formatting function can also be translated by the application of stresses on the dynamics of the change in the correction signal (saturation of the signal, saturation of N-order derivatives of the signal, etc.).

5. LIST OF FIGURES

Other characteristics and advantages of the invention shall appear when reading the following description, given as a non-limiting example, and the accompanying drawings, wherein:

FIG. 1, already described hereinabove in relation with the prior art, shows a simplified diagram of a CPT miniature atomic clock with pulse mode operation, according to the known technique mentioned hereinabove;

FIG. 2, already described hereinabove in relation with the prior art, shows how the Ramsey sequence makes it possible to pulse the output signal received from the dual-frequency laser source that appears in FIG. 1;

FIG. 3, already described hereinabove in relation with the prior art, shows a block diagram of a particular implementation of the pulse control block SERVO_1 that appears in FIG. 1;

FIG. 4, already described hereinabove in relation with the prior art, shows a block diagram of a particular implementation of the pulse control block SERVO_2 that appears in FIG. 1;

FIG. 5, already described hereinabove in relation with the prior art, shows the operation of the pulse control block SERVO_1 of FIG. 3, by showing chronograms of the signal referenced as 140 in FIGS. 1 and 2, as well as of the signals referenced as mod_1, δ_e_1 and δ_c_1 in FIG. 3;

6. DETAILED DESCRIPTION

In all the figures of the present document, identical elements are designated by the same numerical reference.

Figure 6:
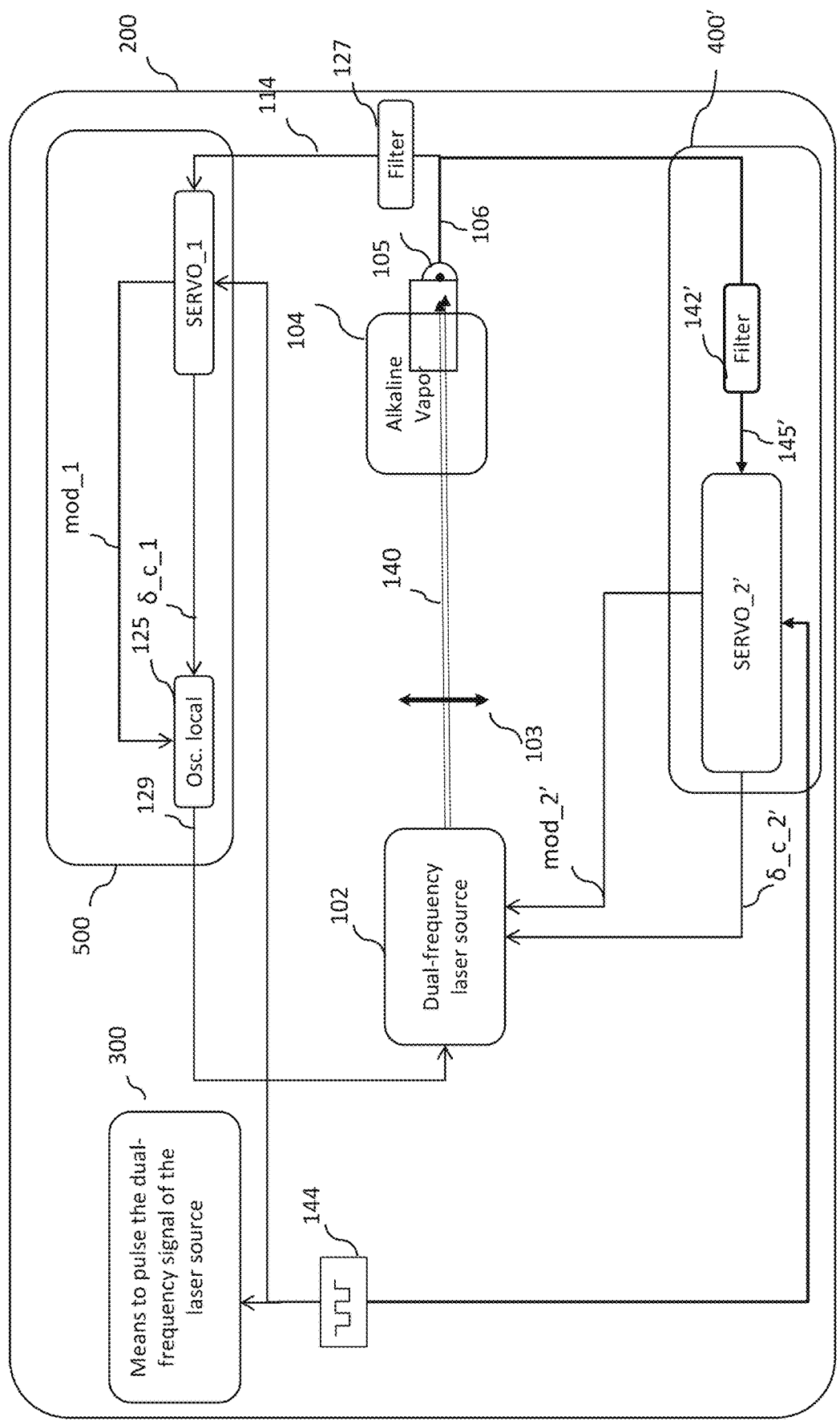
FIG. 6 shows a simplified diagram of a CPT miniature atomic clock with pulse mode operation, according to a particular embodiment of the invention.

In relation with FIG. 6, a miniature atomic clock 200, of the CPT 200 type and with pulse mode operation, according to a particular embodiment of the invention, is now presented.

Figure 1:
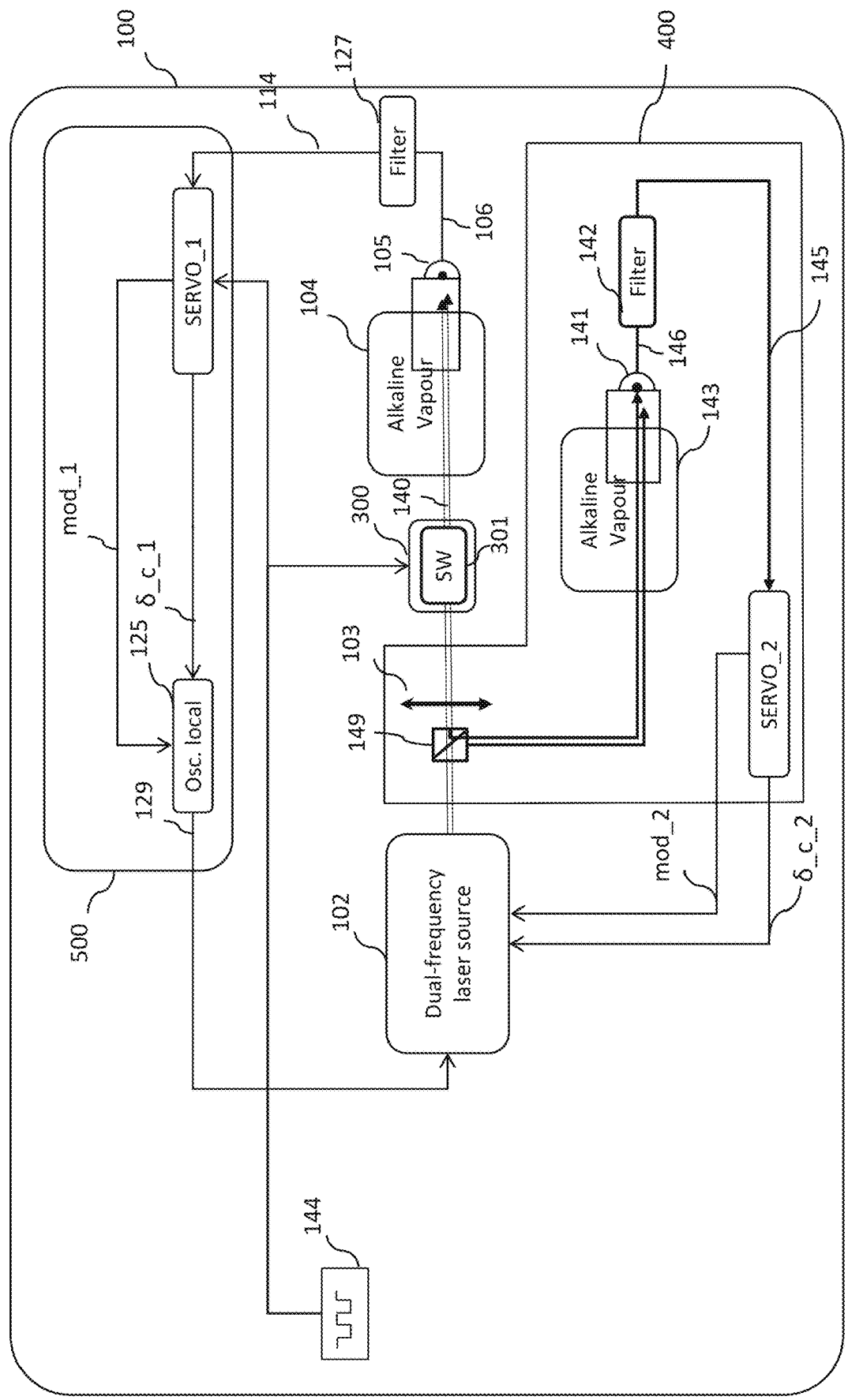
Figure 2:
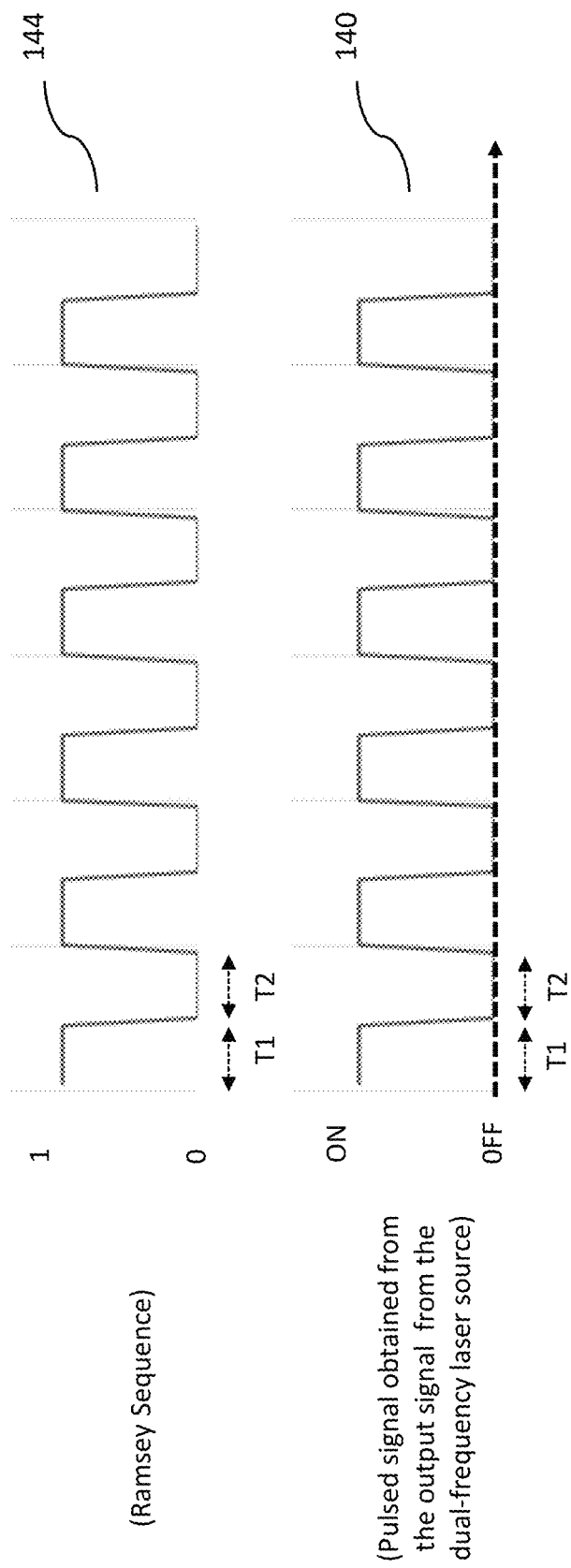
Figure 4:
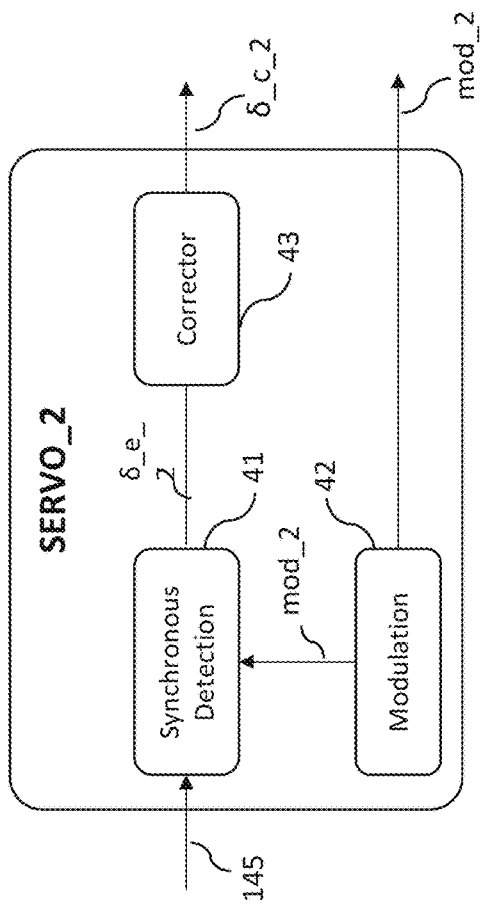
Figure 3:
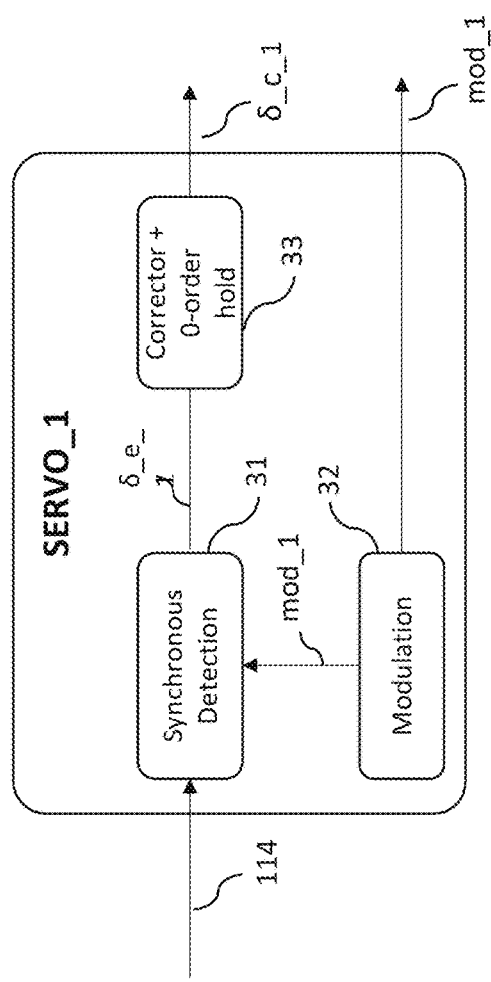

This embodiment is distinguished from the known solution of FIG. 1 in that the feedback control loop for controlling the optical frequency (400', FIG. 6) is not carried out in the same way as that (400, FIG. 1) of the known solution:
  it does not comprise the following elements: the separator 149, the second alkaline vapour microcell 143 and the second photodiode 141;
  the filter 142 is replaced with a filter 142' that receives the output signal 106 from the photodiode 105 and generates a signal 145'; and
  the non-pulsed control block SERVO_2 is replaced with a pulse control block SERVO_2' that receives the signal 145' and the interrogation sequence 144, and provides a correction signal δ_c_2' to the dual-frequency laser source 102, so as to control the optical frequency with it.

The other elements are identical to those of FIG. 1 (they are therefore not described again).

The pulse control block SERVO_2' is configured to act as follows:
  during the period T1, extraction of an error signal δ_e_2' from the signal 145' (itself coming, via the filter 142', from the output signal 106 of the photodiode 105) and generation of the correction signal δ_c_2' from the error signal δ_e_2'; and
  during the period T2, resetting of the error signal δ_e_2' to zero and generation of the correction signal δ_c_2' by extrapolation (any extrapolation technique can be used, in particular but not exclusively based on an n-order hold, with n≥0, or a function for formatting the correction signal, such as detailed hereinbelow).

Thus, with the proposed solution, a single alkaline vapour cell 104 makes it possible to control both the microwave frequency of the local oscillator 125 and the optical frequency of the dual-frequency laser source 102, in the pulse mode operation. Clever use is made of the fact that, during the period T1, the pulsed laser beam at the output of the alkaline vapour microcell 104 carries both: the comparison information between the microwave frequency of the local oscillator 125 and the microwave frequency setpoint, and the comparison information between the optical frequency of the dual-frequency laser source 102 and the optical frequency setpoint.

An associated advantage is a reduction in the cost and in the size of the miniature atomic clock 200 (no separator 149, second alkaline vapour microcell 143 and second photodiode 141).

Furthermore, and as detailed hereinafter in relation to FIGS. 10 to 12, the proposed solution allows for greater freedom in carrying out the means 300 to pulse the dual-frequency signal of the laser source 102, since the control block SERVO_2' is of the pulsed type (see the detailed presentation hereinafter).

In a particular implementation shown in FIG. 7, the pulse control block SERVO_2' comprises:
  a modulation block 42' generating a modulation signal mod_2' used on the one hand by the local oscillator 125 to modulate its output signal, and on the other hand by a synchronous detection block 41' presented hereinbelow (for carrying out demodulation steps internal to the synchronous detection block 41' which will result in the filtering then in the extracting of an error signal δ_e_2');
  the synchronous detection block 41' carrying out a demodulation of the signal 145' coming from the filter 142' (downstream from the photodiode 105), according to the modulation signal mod_2', and generating an error signal δ_e_2'. In other terms, the synchronous detection block 41' makes it possible to extract an error signal δ_e_2' from the signal 1145'; and
  a correction/hold block 43' (with n-order hold, with n≥0) receiving the error signal δ_e_2' and generating the correction signal δ_c_2' (of which the application on the dual-frequency laser source 102 has for objective to minimise the error signal δ_e_2').

Recall that there are several sorts of holds. Their principle is to "recreate" the signal between discrete values provided as input. The simplest is the 0-order hold of which the output retains the same value until the arrival of a new value as input. The order of the hold represents the complexity of the section of curve located between two values: for an order 0, the representation of the output will be a histogram with bars; for an order 1, there will be segments that directly connect two successive values, i.e. a basic linear interpolation; for an order 2, a parabola between two values will be obtained; for an order n, a curve of order n between two successive values will be obtained.

The light shed above makes it possible to understand that the pulse control block SERVO_2' is different from the non-pulsed control block SERVO_2 of the known solution, and therefore cannot simply be replaced by the latter. Indeed, unlike the block SERVO_2, the pulse control block SERVO_2' receives a signal 145' coming from the same alkaline vapour microcell 104 as the signal 114 received by the pulse control block SERVO_1. The signal 145' is constantly interrupted (it can be used only for the durations T1 of the pulses) and carries a first piece of comparison information (between the optical frequency of the dual-frequency laser source 102 and the optical frequency setpoint) generated within the same propagation channel (namely the alkaline vapour microcell 104) as a second piece of comparison information (between the microwave frequency of the local oscillator 125 and the microwave frequency setpoint) carried by the signal 114 used by the control block SERVO_1.

In other terms, the output signal 106 of the photodiode 105 carries the first and second pieces of comparison information, but the first is intended for the pulse control block SERVO_2' while the second is intended for the pulse control block SERVO_1. It is then suitable to separate (orthogonalise) the first and second pieces of comparison information. This is carried out by time division or frequency division multiplexing. In the case of operation with frequency division multiplexing, a filtering solution is set in place. This is the case in the particular implementation of FIG. 6, with the filters 127 and 142' that respectively make it possible to obtain the signals 114 and 145', from the same output signal 106 of the photodiode 105.

Furthermore, in a particular embodiment, in order to optimise the calculation of the error signal δ_e_2', the modulation signal mod_2' and the interrogation sequence 144 are linked by one of the following relationships: $f_m = K \times 1/T1$ and $1/T1 = K' \times f_m$, with $f_m$ the frequency of the modulation signal mod_2', and K and K' belonging to natural integers. In other terms, the modulation signal mod_2' is synchronous with the pulses (of duration T1) of the interrogation sequence 144.

Even more particularly, in the case where the modulation signal mod_2' and the interrogation sequence 144 are linked by the relationship: $f_m = K \times 1/T1$, K is chosen such that: $1 \leq K \leq 30$. This has the advantage of having a modulation frequency $f_m$ that is high enough to be able to control the optical frequency of the dual-frequency laser source with a frequency band wherein the noise of the dual-frequency laser source is low, and a modulation frequency $f_m$ that is low enough to prevent excessively energy-consuming electronics. For example, take: K=3 and (1/T1)=3 kHz, which leads to: $f_m$=9 kHz.

Figure 5:
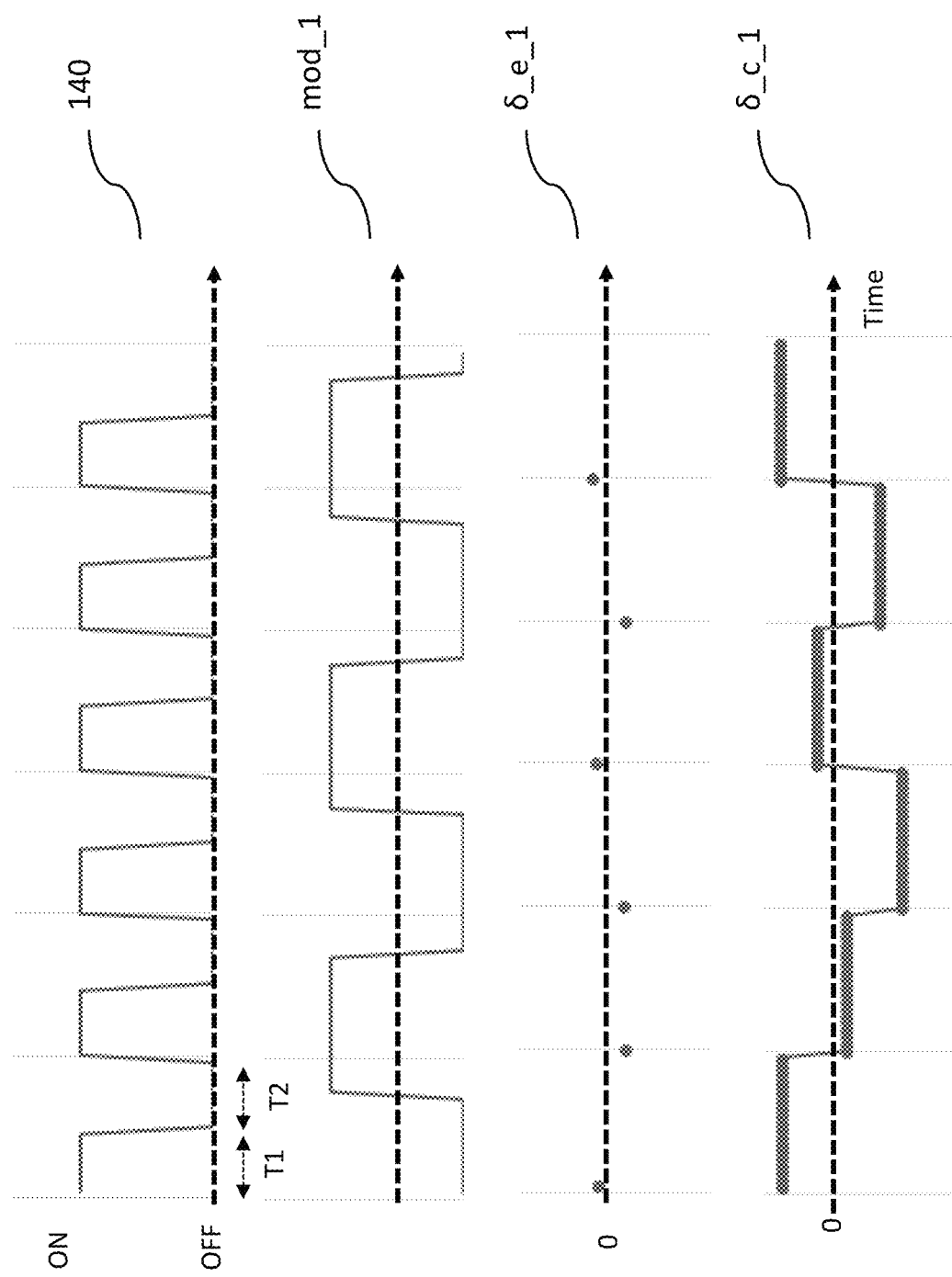

The pulse control block SERVO_1 also operates differently from the pulse control block SERVO-2' since the block SERVO_1 operates with: $1/(T1+T2) = K'' \times f_{m1}$, with K'' belonging to natural integers (K''=2 in the example of FIG. 5) and $f_{m1}$ the frequency of the modulation signal mod_1. Furthermore, the block SERVO_1 requires the pulsed nature of the source (no error information possible if no Ramsey-type interrogation sequence).

On the contrary, the block SERVO_2' undergoes the pulsed nature of the source and has access to useful information only during T1. Indeed, as already mentioned hereinabove, the signal 145' entering the pulse control block SERVO_2' is constantly interrupted. Indeed, the comparison information between the optical frequency of the laser and the optical frequency of the atom is available only when the dual-frequency is on, i.e. during the period T1. During the period T2, the dual-frequency is off and the comparison information is not available. The proposed solution makes it possible to operate the pulse control block SERVO_2' in this interrupted mode.

In a particular embodiment, the synchronous detection block 41' (see FIG. 7) is configured to generate the error signal δ_e_2' at R times the frequency $f_m$ of the modulation signal mod_2', with R an even number belonging to natural integers and R≥2. In this way, the output signal 106 of the photodiode 105 is sampled at a frequency $R*f_m$, which makes it possible to generate at the same frequency successive values of the error signal δ_e_2'. Because R≥2, there is at least one value of the error signal for each state of the modulation signal. Choosing an even value of R makes it possible to facilitate the work of a calculator comprised in the pulse control block SERVO_2' (we thus have an identical number of samples per state of modulation, which facilitates the calculation of the synchronous detection block and the general synchronisation of the signals). The values R=2 and R=4 correspond to a good precision/consumed energy compromise. Indeed, increasing the value of R increases the precision of the measurement (robustness to noise) but requires more rapidity (calculation and sampling).

The correction signal is generated by the correction/hold block 43'. When the comparison information enters the optical frequency of the laser and the optical frequency of the atom is available (i.e. during T1), the correction signal is generated conventionally. When it is not available (i.e. during T2), the correction signal is generated by the n-order hold function, with n≥0, or a function for formatting the correction signal.

Figure 7:
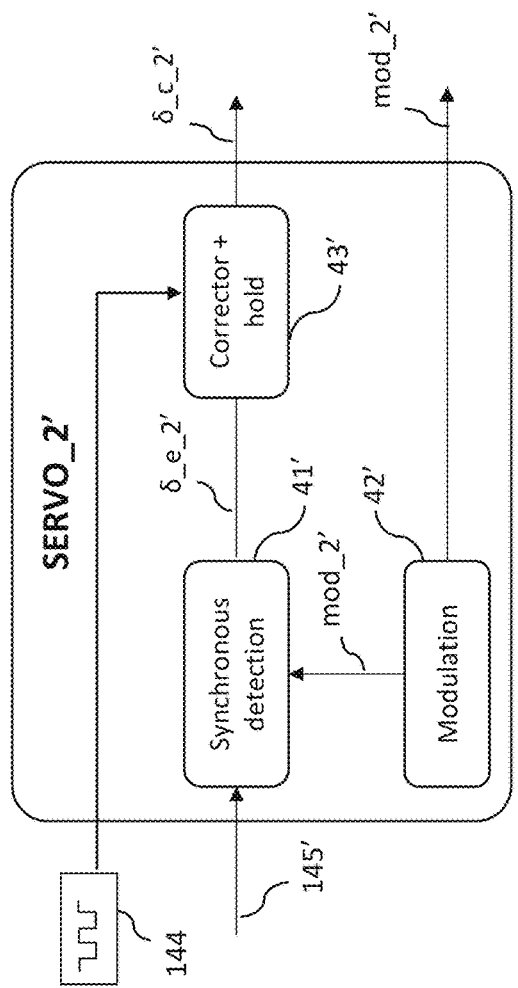
FIG. 7 shows a block diagram of a particular implementation of the pulse control block SERVO_2' that appears in FIG. 6.
Figure 8:
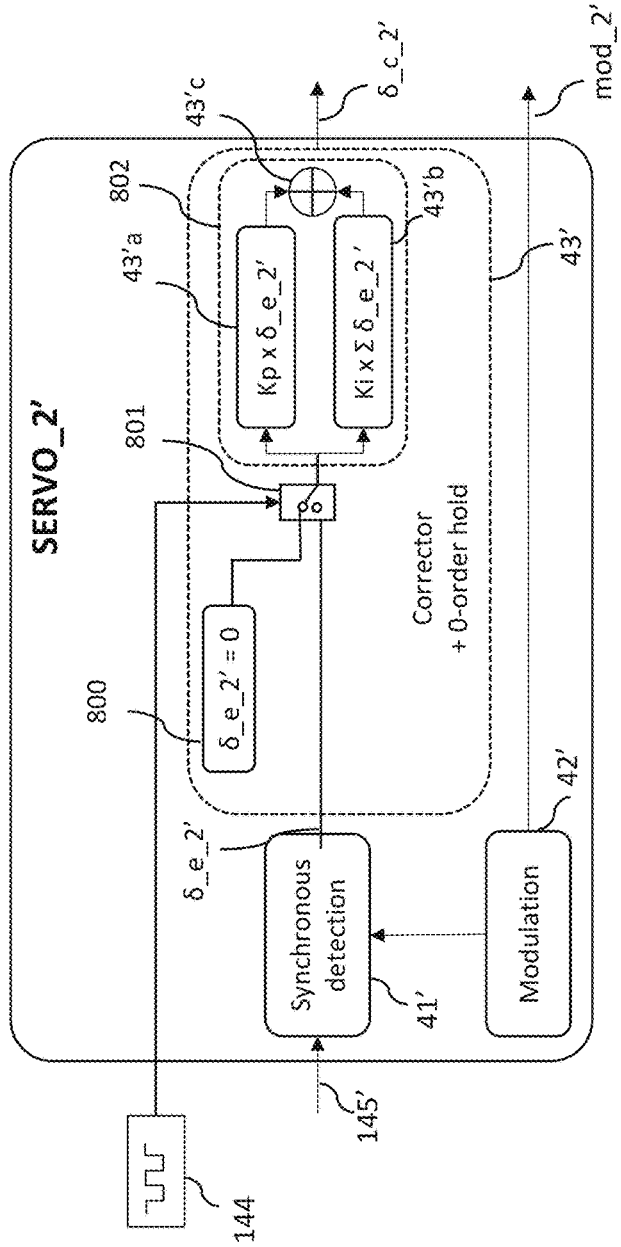
FIG. 8 shows an embodiment of the pulse control block SERVO_2' of FIG. 7.

FIG. 8 shows an embodiment of the pulse control block SERVO_2' of FIG. 7, in the case where the correction/hold block 43' integrates a 0-order hold. In other terms, the pulse control block SERVO_2' is in this case configured so that, during the period T2, the generation of the correction signal δ_c_2' by extrapolation is carried out using a 0-order hold.

In this embodiment, the correction/hold block 43' comprises:
- a corrector 800 of the "Proportional Integral (PI)" type, comprising a first branch 43'*a* carrying out a proportional function (Kp×δ_e_2'), a second branch 43'*b* carrying out an integral function (Ki×Σδ_e_2') and a summing element 43'*c* that adds the results of the first and second branches in order to generate the correction signal δ_c_2'; and
- a switch (switch function) 801, receiving on the one hand the error signal δ_e_2' generated by the synchronous detection block 41' and on the other hand a null error signal 800 (i.e. δ_e_2'=0), and controlled by the interrogation sequence 144 as follows: during the period T1, providing the corrector 800 with the error signal δ_e_2' generated by the synchronous detection block 41', and during the period T2, providing the corrector 800 with the null error signal 800.

Thus, during the period T1 (i.e. while the signal 145' is carrying the comparison information between the optical frequency of the dual-frequency laser source 102 and the optical frequency setpoint), the error signal provided by the synchronous detection block 41' is used to calculate a correction of the "PI" type. On the other hand, during the period T2 (i.e. while the signal 145' is not carrying the comparison information between the optical frequency of the dual-frequency laser source 102 and the optical frequency setpoint), the null error signal is used to extrapolate a correction (the first branch 43'*a* provides a null result (Kp×δ_e_2'=0), but the second branch 43'*b* provides a non-null result (Ki×Σδ_e_2'≠0) because it retains memory of the errors calculated during the period T1.

This embodiment has the advantage of adding only a slight modification (adding of the switch function 801) to the conventional structure of corrector 800 of the "PI" type.

Figure 9:
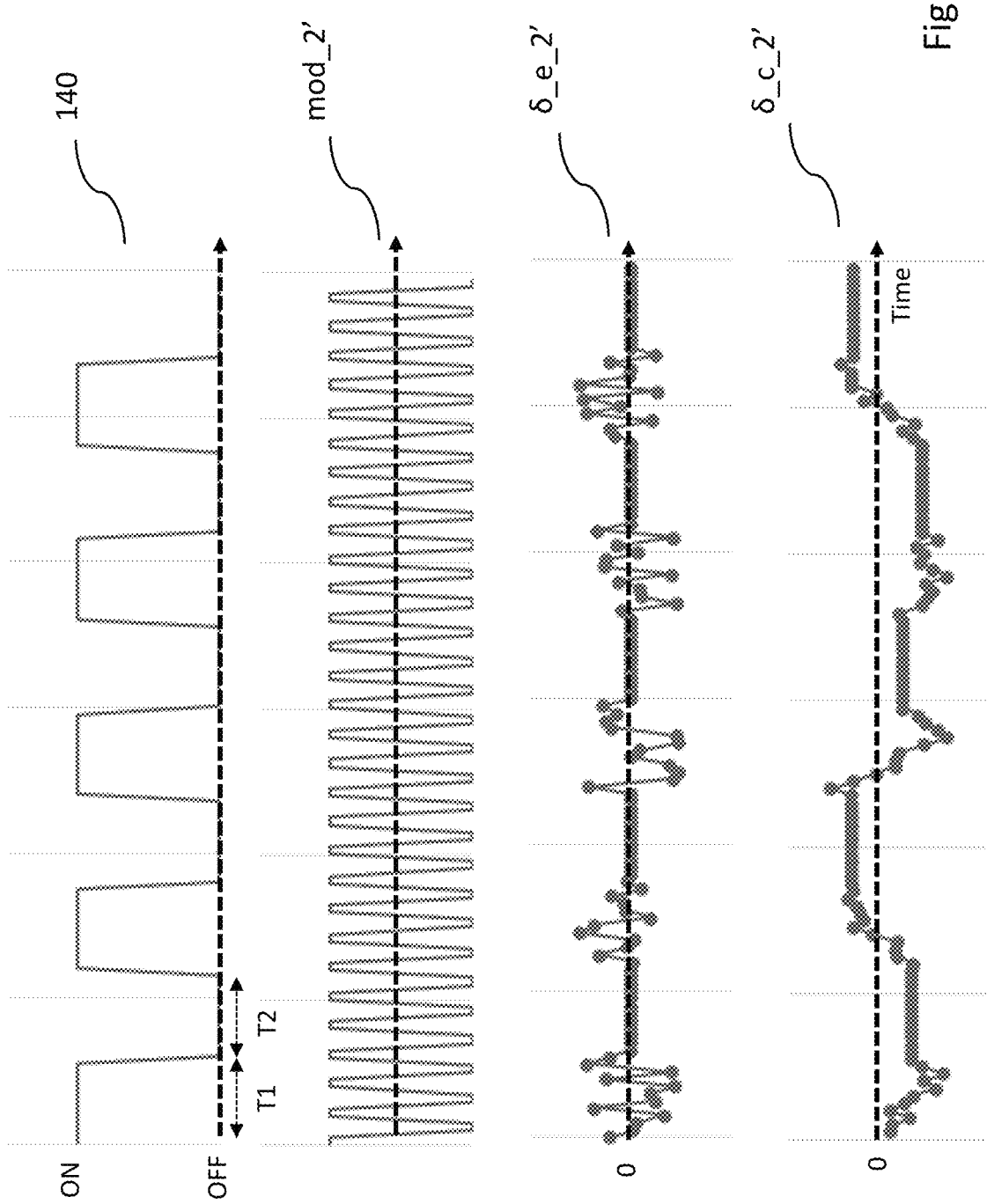
FIG. 9 shows the operation of the pulse control block SERVO_2' of FIG. 8, by showing chronograms of the signal referenced as 140 in FIG. 6, as well as of the signals referenced as mod_2', δ_e_2' and δ_c_2' in FIG. 8.

FIG. 9 shows the operation of the pulse control block SERVO_2' of FIG. 8, by showing chronograms of the signal 140 (see FIG. 6), as well as signals mod_2', δ_e_2' and δ_c_2' (see FIG. 8).

Thus, in the case of a corrector "PI", the proposed solution consists of:
- cancelling the proportional action during the period T2 (i.e. between two pulses of the interrogation sequence 144). For example, this is done by implementing an analogue switching or an algorithmic cancellation of the calculation of the proportional action; and
- keeping the integral action constant during the period T2. For example, this is done by keeping the charge of a capacitive element of a filter or by keeping constant the value of a digital accumulator.

In a first alternative embodiment of the pulse control block SERVO_2', the corrector 800 of the "Proportional Integral (PI)" type is replaced with a corrector of the "Proportional Integral Derivative (PID)" type. In this case, the proposed solution consists of:

cancelling the proportional action during the period T2 (i.e. between two pulses of the interrogation sequence 144). For example, this is done by implementing an analogue switching or an algorithmic cancellation of the calculation of the proportional action; and keeping the integral action constant during the period T2. For example, this is done by keeping the charge of a capacitive element of a filter or by keeping constant the value of a digital accumulator;

adjusting the derivative action calculated at the start of a pulse (of duration T1). For example, this is done by cancelling the initial value of the derivative action during a new pulse, or by weighting ("coefficienting") this action by the duration T2 between the two pulses.

In a second alternative embodiment of the pulse control block SERVO_2', the correction/hold block 43' integrates an N-order hold, with n≥0, or a function for formatting the correction signal. In other terms, the pulse control block SERVO_2' is in this case configured so that, during the period T2, the generation of the correction signal δ_c_2' by extrapolation is carried out using an N-order hold or a function for formatting the correction signal. This makes it possible to control the optical frequency more continuously. The function for formatting the signal can be an extrapolation which has the advantage of compensating the deviations well of which the frequency variation is less than 1/T1. The formatting can also be translated by the application of stresses on the dynamics of the change in the correction signal (saturation of the correction signal, saturation of N-order derivatives of the correction signal).

As mentioned hereinabove, the proposed solution makes it possible, contrary to the known solution, to consider various ways of carrying out the means 300 to pulse the dual-frequency signal of the laser source 102. Without being exhaustive, various implementations are presented hereinbelow.

Figure 10:
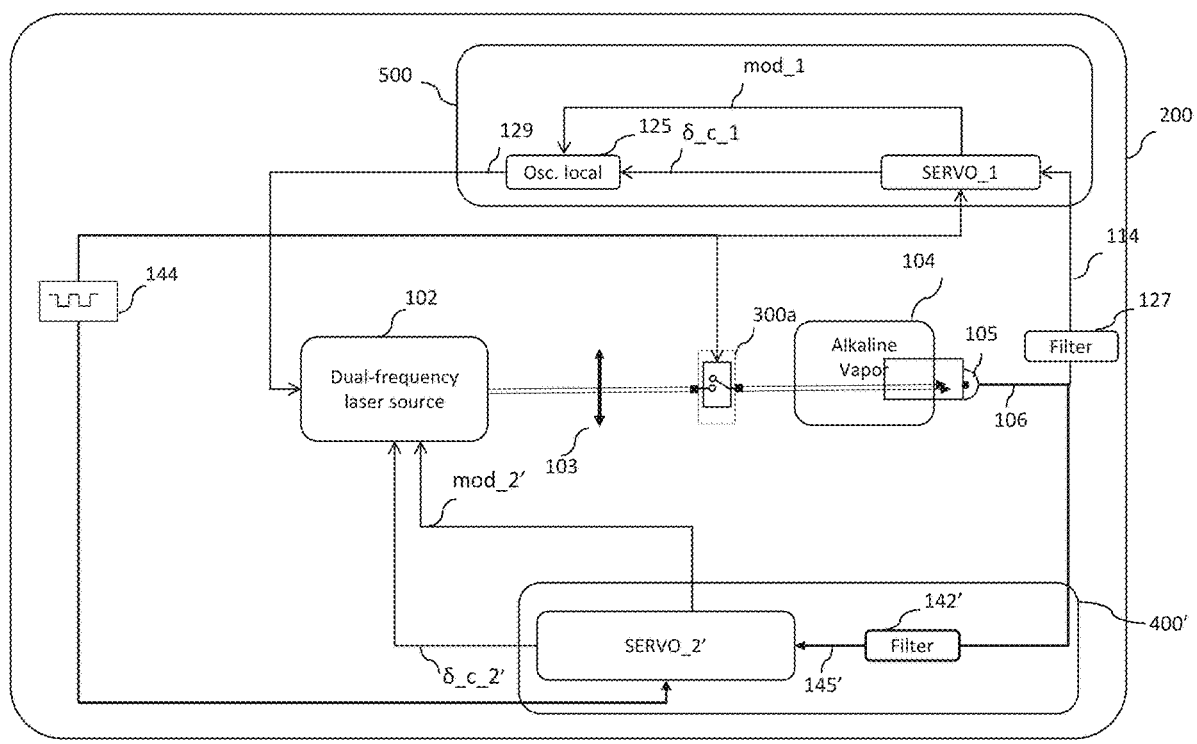
FIG. 10 shows a first manner of carrying out the means referenced as 300 in FIG. 6 (means to pulse the dual-frequency signal of the laser source)

FIG. 10 shows a first manner of carrying out the means 300. It consists of inserting an optical switch 300a between the dual-frequency laser source 102 and the alkaline vapour microcell 104. This optical switch 300a is controlled in opening and closing by the Ramsey sequence 144.

Figure 11:
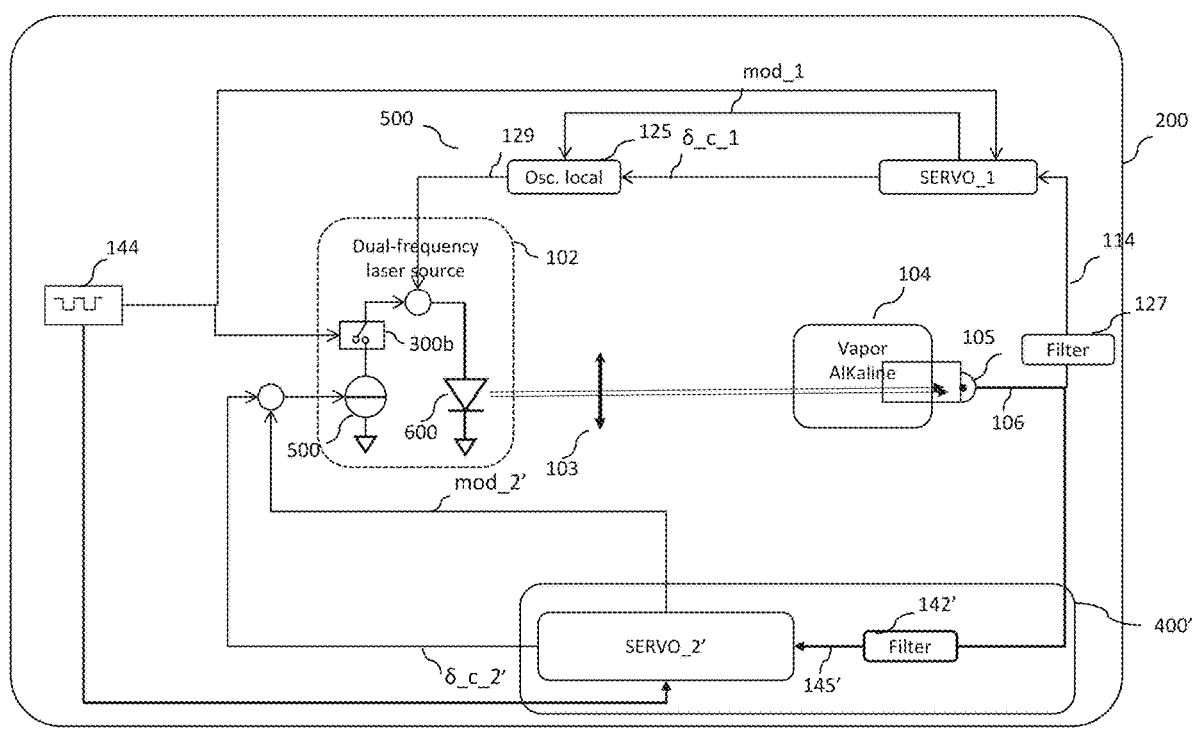
FIG. 11 shows a second manner of carrying out the means referenced as 300 in FIG. 6.

FIG. 11 shows a second manner of carrying out the means 300. It consists, within the dual-frequency laser source 102, of inserting an electrical switch 300b on the source of current 500 that supplies the laser diode 600. This electrical switch 300b is controlled in opening and closing by the Ramsey sequence 144.

Figure 12:
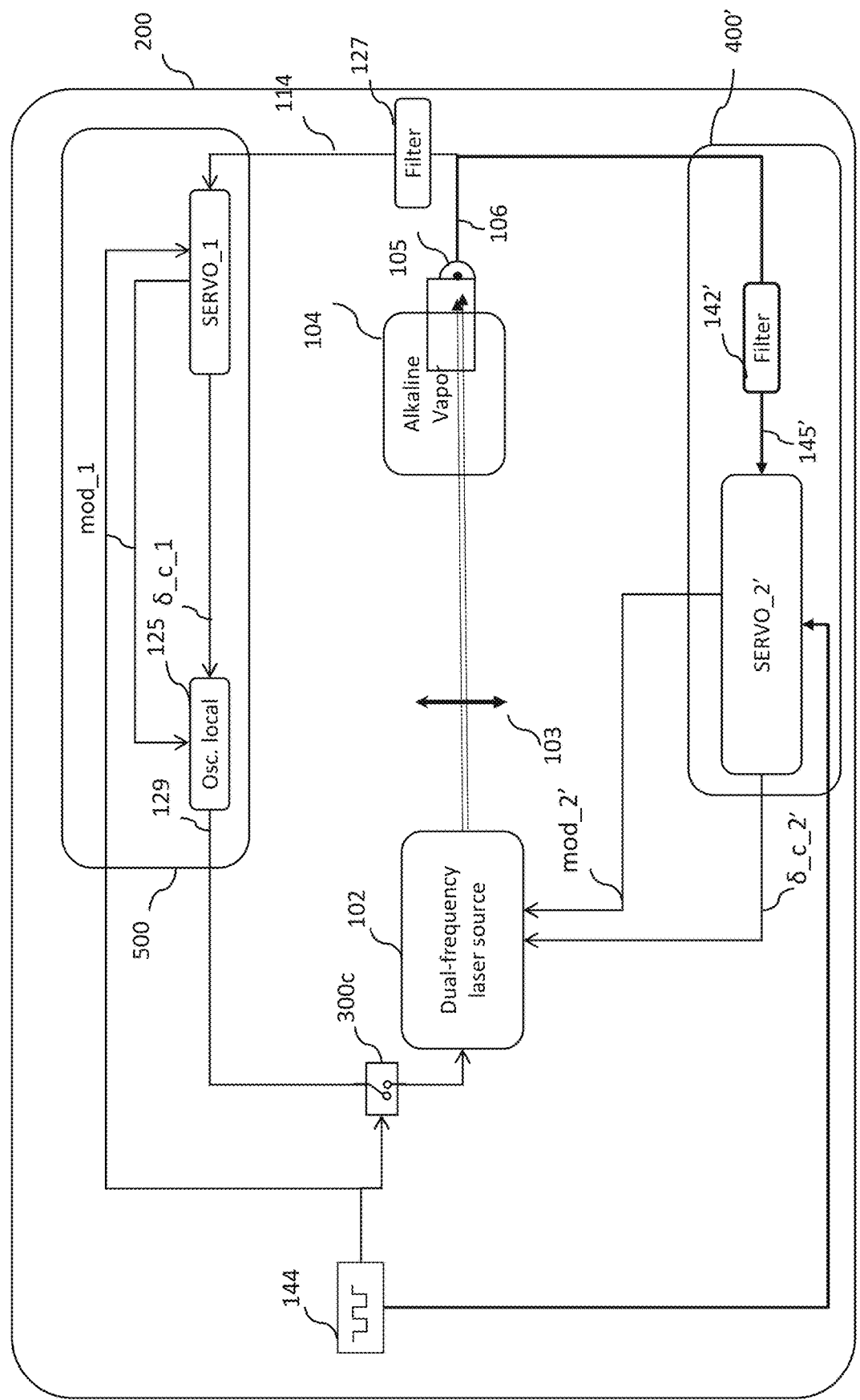
FIG. 12 shows a third manner of carrying out the means referenced as 300 in FIG. 6.

FIG. 12 shows a third manner of carrying out the means 300. It consists of inserting an electrical switch 300c on the signal 129 coming from the local oscillator 125. This electrical switch 300c is controlled in opening and closing by the Ramsey sequence 144.

A fourth manner (not shown) consists of interrupting the dual-frequency operation of the laser source 102 by turning off within it the element that makes it dual-frequency. The interruptions are controlled by the Ramsey sequence 144. Such an element is described for example in the following article: "*Tunable dual-frequency laser source for coherent population trapping cesium atomic clock*", DOI: 10.1117/12.2309273.

At least one embodiment of the present application overcomes the aforementioned disadvantages of the prior art.

More precisely, at least one embodiment provides a CPT miniature atomic clock with pulse mode operation, that makes it possible to satisfy the need described hereinabove, namely offering a new size/cost/performance compromise, oriented towards low cost and small size, while still degrading performance as little as possible.

At least one embodiment provides such a CPT miniature atomic clock that offers more freedom than the known solution for the implementing of means 300 configured to pulse the output signal received from the dual-frequency laser source 102.

At least one embodiment provides such a CPT miniature atomic clock that is simpler to manufacture and implement than that of the known solution discussed hereinabove.

Although the present disclosure has been described with reference to one or more examples, workers skilled in the art will recognize that changes may be made in form and detail without departing from the scope of the disclosure and/or the appended claims.

The invention claimed is:

1. A miniature atomic clock with pulse mode operation and comprising:

a local oscillator having a microwave frequency;

a dual-frequency laser source receiving an output signal from the local oscillator and having an optical frequency;

means for pulsing an output signal from the dual-frequency laser source, according to a Ramsey-type interrogation sequence comprising pulses with a duration T1 separated by intervals with a duration T2;

an alkaline vapour microcell receiving the output signal from the dual-frequency laser source and using coherent population trapping;

a photodiode receiving an output signal from the alkaline vapour microcell;

a feedback control loop for controlling the microwave frequency, receiving an output signal from the photodiode and configured to control the microwave frequency of the local oscillator at a microwave frequency setpoint according to the alkaline vapour microcell; and a feedback control loop for controlling the optical frequency, configured to control the optical frequency of the dual-frequency laser source at an optical frequency setpoint, wherein the feedback control loop comprises a pulse control block receiving the output signal from the photodiode and the interrogation sequence, and providing a correction signal to the dual-frequency laser source by being configured to act as follows:

during the period T1, extracting an error signal from the output signal received from the photodiode and generating the correction signal from the error signal; and during the period T2, resetting the error signal to zero and generating the correction signal by extrapolation.

2. The miniature atomic clock according to claim 1, which comprises a modulation block generating a modulation signal used by the dual-frequency laser source to modulate the output signal received from the dual-frequency laser source;

wherein:

the pulse control block comprises:

a synchronous detection block carrying out a demodulation of the output signal received from the photodiode according to the modulation signal, and generating the error signal; and a correction block receiving the error signal and generating the correction signal;

the modulation signal and the interrogation sequence are linked by one of the following relationships: $f_m = K \times 1/$ T1 and $1/T1 = K' \times f_m$ with $f_m$ the frequency of the modulation signal, and K and K' belonging to natural integers.

3. The miniature atomic clock according to claim 2, wherein the modulation signal and the interrogation sequence are linked by the relationship: $f_m = K \times 1/T1$, and in that: $1 \leq K \leq 30$.

4. The miniature atomic clock according to claim 2, wherein the synchronous detection block is configured to generate the error signal at R times the frequency $f_m$ of the modulation signal, with R an even number belonging to natural integers, and $R \geq 2$.

5. The miniature atomic clock according to claim 1, wherein the pulse control block is configured so that, during the period T2, the generation of the correction signal by extrapolation is carried out using a 0-order hold.

6. The miniature atomic clock according to claim 1, wherein the pulse control block is configured so that, during the period T2, the generation of the correction signal by extrapolation is carried out using an N-order hold, with $N > 0$ or a function for formatting the correction signal.

\* \* \* \* \*